(12) United States Patent
Lee

(10) Patent No.: US 6,342,797 B1
(45) Date of Patent: Jan. 29, 2002

(54) DELAYED LOCKED LOOP CLOCK GENERATOR USING DELAY-PULSE-DELAY CONVERSION

(75) Inventor: Seong-Hoon Lee, Ichon-shi (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/475,226

(22) Filed: Dec. 30, 1999

(30) Foreign Application Priority Data

Dec. 30, 1998 (KR) .......................................... 98-61113

(51) Int. Cl.[7] ................................................ H03L 7/06
(52) U.S. Cl. ........................................ 327/156; 327/263
(58) Field of Search ................................ 327/154, 155, 327/156, 158, 161, 162, 163, 263, 270, 271, 277; 375/293

(56) References Cited

U.S. PATENT DOCUMENTS

| | | | |
|---|---|---|---|
| 4,649,438 A | | 3/1987 | Shimizu et al. ............. 358/337 |
| 4,922,141 A | * | 5/1990 | Lofgren et al. ............. 327/244 |
| 5,661,427 A | * | 8/1997 | McBribe et al. ............. 327/236 |
| 6,002,281 A | * | 12/1999 | Jones et al. ................. 327/161 |
| 6,125,157 A | * | 9/2000 | Donnelly et al. ............ 327/158 |

FOREIGN PATENT DOCUMENTS

| | | | |
|---|---|---|---|
| EP | 0655840 A2 | 5/1995 | ............ H03L/7/081 |
| EP | 0655840 A3 | 5/1995 | ............ H03L/7/081 |
| EP | 0762262 A1 | 3/1997 | ............. G06F/1/08 |
| GB | 2326258 A | 12/1998 | ............ G03L/7/081 |

\* cited by examiner

*Primary Examiner*—Timothy P. Callahan
*Assistant Examiner*—Linh Nguyen
(74) *Attorney, Agent, or Firm*—Jacobson Holman, PLLC

(57) ABSTRACT

A delayed locked loop (DLL) clock generator in DDR SDRAM is disclosed. The DLL clock generator comprises a pulse generator for generating a pulse signal of which a pulse width corresponds to a predetermined delay time; a first delay chain including a plurality of delay means, for delaying the pulse signal by a predetermined delay time in order; and a second delay chain having the same delay time as the first delay chain, for delaying an external clock signal responsive to an output signal from the delay means. The second clock signal is generated through the same path as a path through which the external clock signal is inputted and the delayed external clock signal is outputted.

6 Claims, 11 Drawing Sheets

DELAYED LOCKED LOOP CLOCK GENERATOR USING DELAY-PULSE-DELAY CONVERSION

BACKGROUND OF THE INVENTION

1. Field of the Invention

The present invention relates to a clock generator; and more particularly to a delayed locked loop (DLL) clock generator in double data rate (DDR) synchronous random access memory (SDRAM).

2. Prior Art of the Invention

In general, a module in a semiconductor memory circuit is synchronized with clocks and performs various functions, for example, reading data from a memory cell or writing data to the memory cell. The synchronization is performed in accordance with clock signals generated in a clock generator. In a semiconductor device, a clock signal having a certain period is used in order to compensate skew between a clock signal and a data signal or between two clock signals. More particularly, in DDR SDRAM, when the data signal is outputted in synchronization with a clock, there is a skew due to an input delay of the clock and a data-out path delay. Accordingly, an additional internal clock is used for compensating the skew due to the delay mentioned above.

Referring to FIG. 1, when a data signal is outputted in synchronization with a clock signal clk, a skew $t_{d1}$ occurs. For compensating the skew $t_{d1}$, a new clock signal is used, which refers to a DLL (Delay Locked Loop) clock signal dll_clk. If the data signal is synchronized with the DLL clock signal dll_clk, the data signal is outputted without the skew $t_{dl}$.

The DLL clock signal dll_clk precedes the clock signal clk by the input delay $t_{d1}$. Substantially, the DLL clock signal dll_clk is generated by delaying the clock signal as much as a subtraction $t_{d2}$ of the input delay $t_{d1}$ from a period $t_{ck}$ of the clock signal. That is, a substantial delay value can be expressed by the equation as follows:

$$t_{d2}=t_{ck}-t_{d1}.$$

However, a conventional DLL circuit generates an internal clock signal compensating the skew after a considerably long time.

SUMMARY OF THE INVENTION

Therefore, an object of the invention is to provide a DLL generator having a shorter locking time.

To obtain the object of the present invention, there is provided an apparatus for generating a delayed locked loop (DLL) clock signal, comprising: a first clock generator for receiving a first clock signal which is an external synchronization clock signal and has a first time period, and for generating a second clock delayed by a first delay time in comparison with the first clock; a second clock generator for generating a first control signal having a pulse width corresponding to a difference between the first time period and the first delay time; and a third clock generator for generating a DLL clock signal which is slower than the first clock signal by the pulse width of the first control signal.

To obtain the object of the present invention, there is provided an apparatus for generating a delayed locked loop (DLL) clock signal, comprising: a pulse generator for generating a pulse signal of which a pulse width corresponds to a predetermined delay time; a first delay chain including a plurality of delay means, for delaying the pulse signal by a predetermined delay time in order; and a second delay chain having the same delay time as the first delay chain, for delaying an external clock signal responsive to an output signal from the delay means.

BRIEF DESCRIPTION OF THE DRAWINGS

These and other features, aspects, and advantages of the present invention will be better understood with regard to the following description, appended claims, and accompanying drawings where:

DETAILED DESCRIPTION OF THE INVENTION

Hereinafter, preferred embodiments of the present invention will be described with reference to the accompanying drawings in detail.

Figure 1:
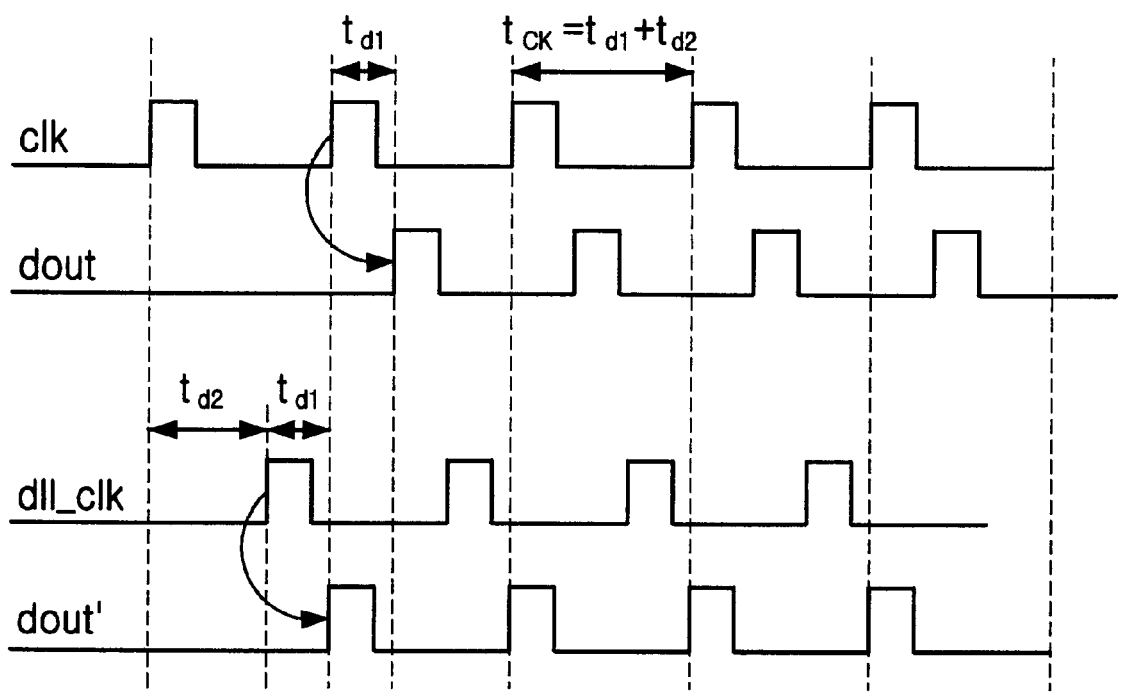
FIG. 1 is a timing diagram illustrating generation of DLL clock in accordance with a conventional DLL clock generator.
Figure 2:
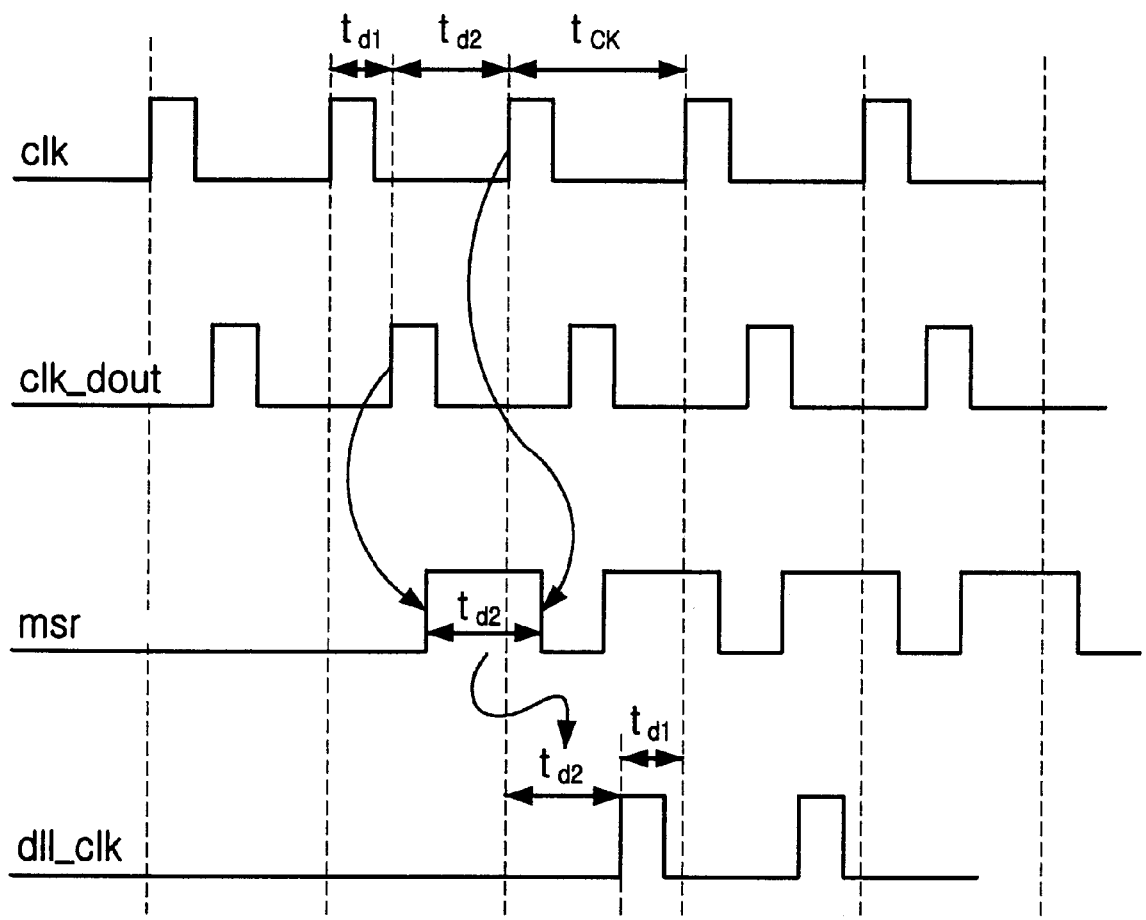
FIG. 2 is a timing diagram illustrating generation of DLL clock in accordance with the present invention.

Referring to FIG. 2, a DLL clock generator generates a first control signal msr using two clock signals, a first clock signal clk and a second clock signal clk_dout. More particularly, the first control signal msr has a pulse width which is a subtraction $t_{d2}$ of the delay $t_{d1}$ from a period $t_{ck}$ of the clock signal. The second clock signal clk_dout is generated by delaying the first clock signal clk by the delay $t_{d1}$ through the delay model. Accordingly, the second clock signal clk_dout has the same timing as the uncompensated data output signal in FIG. 1.

The pulse width of the first control signal is converted to a time delay having the same value as the pulse width $t_{d2}$ of the first control signal, by a delay chain. The DLL clock signal dll_clk is generated by delaying the first clock signal by the time delay. In other words, a time delay to be compensated is converted to a pulse signal, and the pulse signal is converted again to the time delay.

Figure 3:
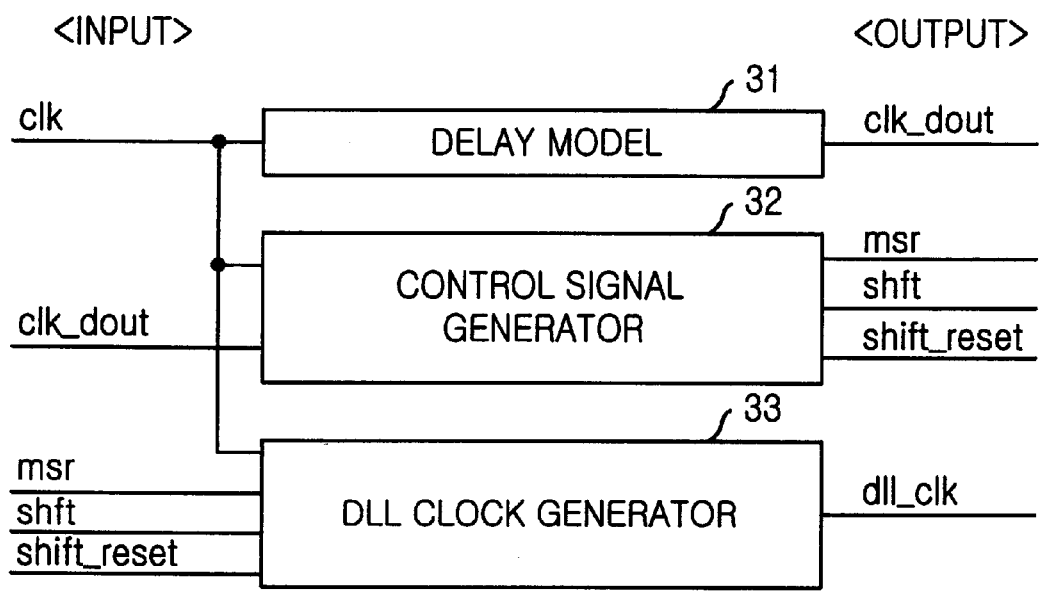
FIG. 3 is a block diagram illustrating DLL clock generator in accordance with the present invention.
Figure 7:
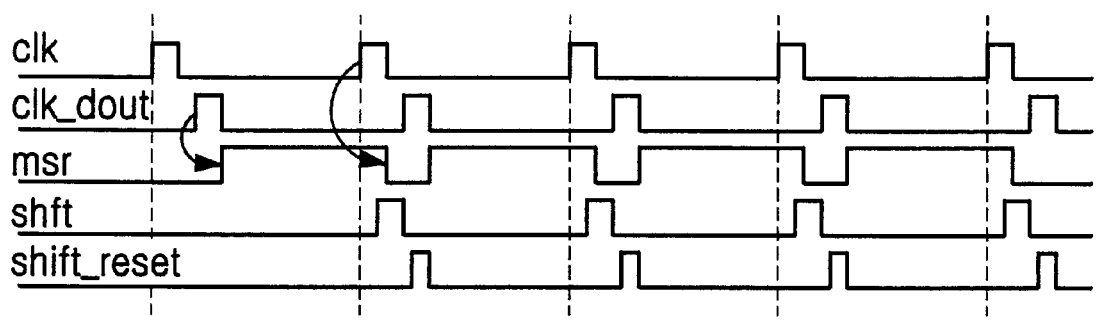
FIG. 7 is a timing diagram of signals in FIG. 4.

Referring to FIG. 3, there is a block diagram for implementing the generation of the DLL clock signal as mentioned above with reference to FIG. 2. A delay model 31 receives an external first clock signal clk and generates a second clock signal having the same timing as an uncompensated data output signal. A control signal generator 32 receives the first and the second clock signals clk and clk_dout and generates a first, a second and a third control signals msr, shft and shift_reset. A DLL generator 33 receives the first to third control signals and generates DLL clock signal dll_clk. Timings of the control signals are illustrated in FIG. 7. The delay model 31 and the control signal generator 32 are not subject matters of the present invention, therefore, detailed description of them will be skipped in this specification.

Figure 4:
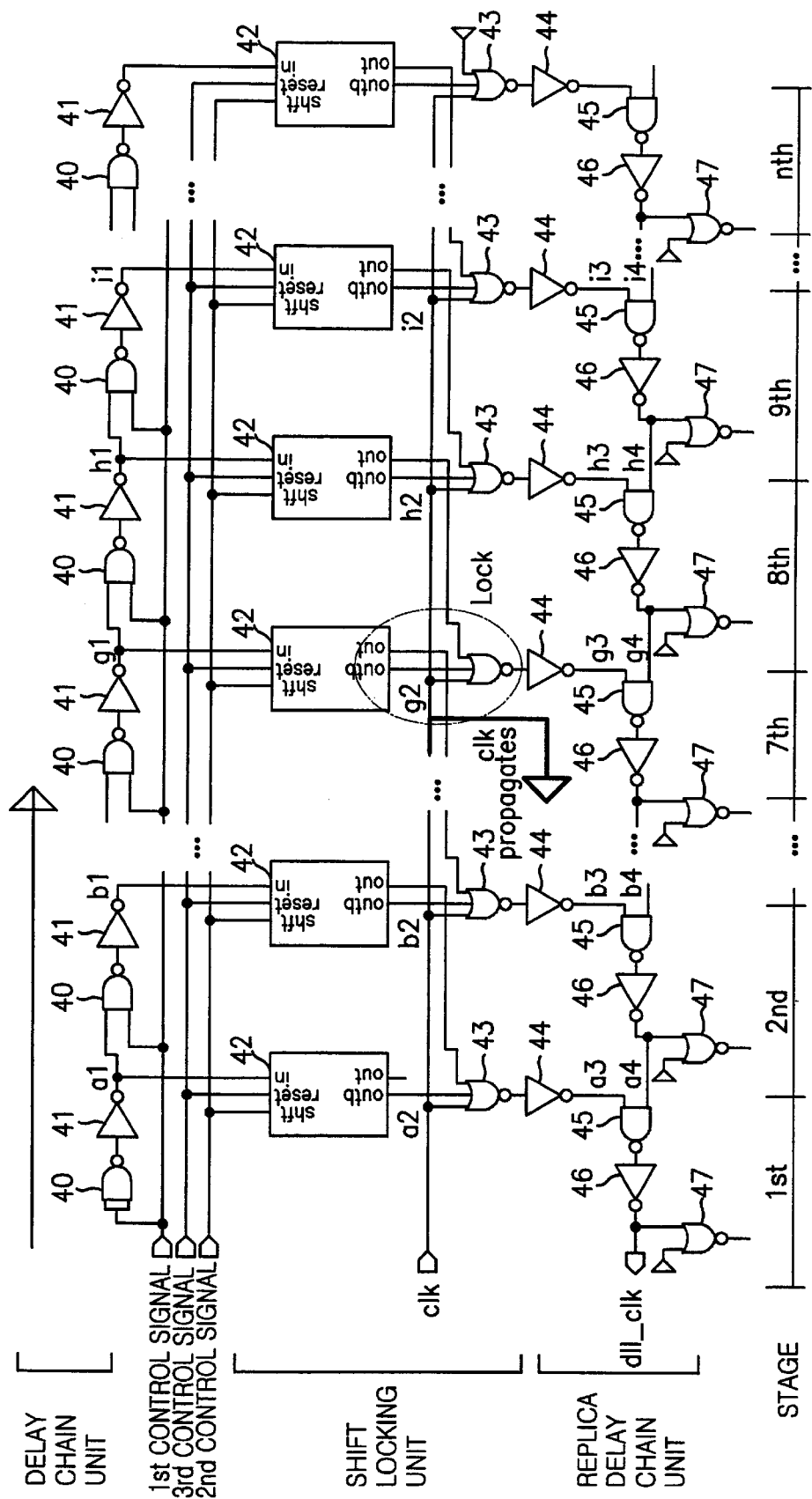
FIG. 4 is a circuit diagram of the DLL clock generator in accordance with the present invention.
Figure 5:
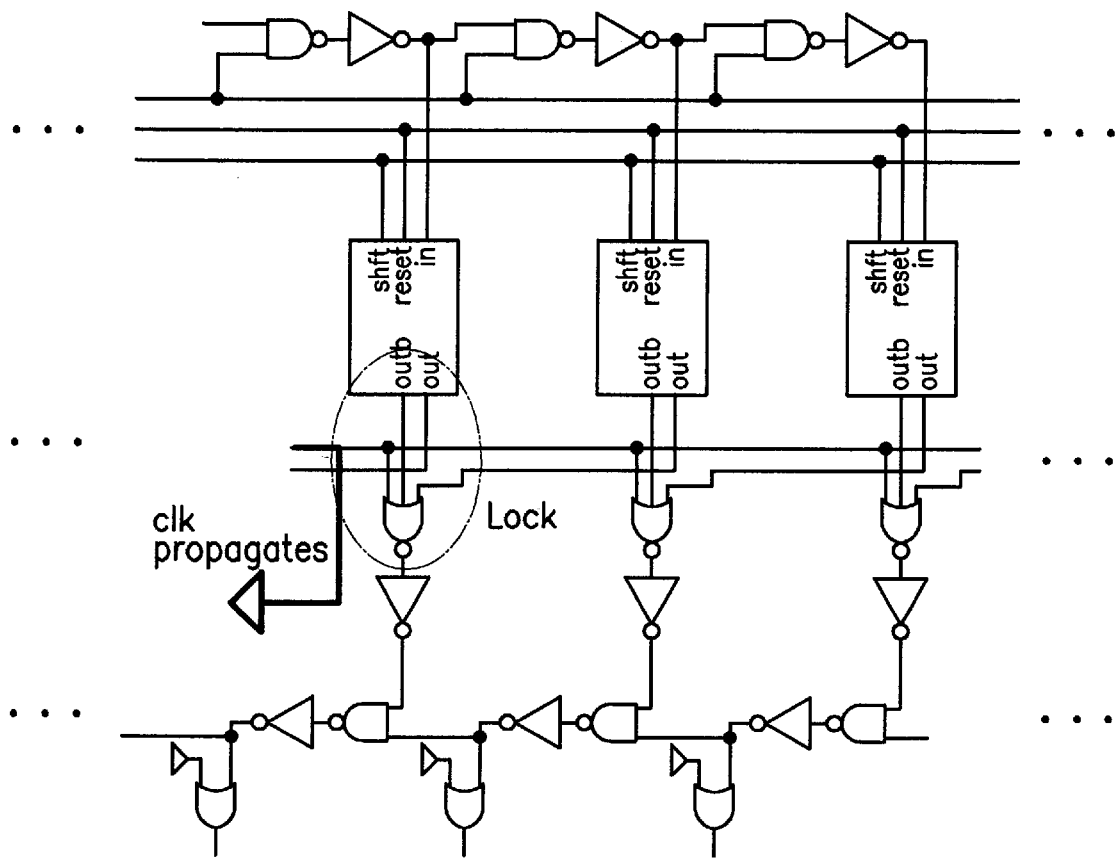
FIG. 5 is a detailed circuit diagram of the FIG. 4.

FIG. 4 shows a circuit diagram of the DLL clock generator 33 in FIG. 3. FIG. 5 is a detailed circuit diagram of FIG. 4.

Referring to FIG. 4, the DLL clock generator comprises a delay chain unit, a shift and locking unit and a replica delay chain unit. Each element in the delay chain unit, the shift and locking unit and the replica delay chain unit, are coupled and formed to a stage. The DLL clock generator comprises these stages coupled in serial.

The delay chain unit delays and propagates the pulse width of the first control signal. The shift and locking unit includes shifters 42 each of which stores an output of the delay chain and outputs two clock signals to three input NOR gate 43.

The shifter 42 receives and stores the data signal while the reset pulse is a low level, and shifts the stored data to the next stage when a second control signal shft becomes a high level. Hence, when the reset pulse becomes a high level while 'in' node is a low level, status of output nodes Ab and A of the shifter are respectively returned to the high level and the low level. In lower part of FIGS. 4 and 5, there are a plurality of replica delay chains each having the same delay as that of the delay chain. The replica delay chain receives the external clock signal and outputs DLL clock signals.

The deal chain unit comprises a pluraliyt stages of delay chains coupled with each other in serial, and controls the pulse width of the first control signal by a delaying rising timing of the first control signal msr. Each stae of the delay chain unit includes a NAND gate 40 having two inputs and an inverter 41 inverting the output of the NAND gate 40. The NAND gate 40 in the first stage receives and feeds the first control signal to the inverter 41. Each of the NAND gate 40 in the others stages receives and performs NAND logical operations of the first control signal and the output signal of the inverter in the previous stage. The output of the NAND logical operation is applied to the inverter 41 inverting the output of the NAND gate.

Figure 8:
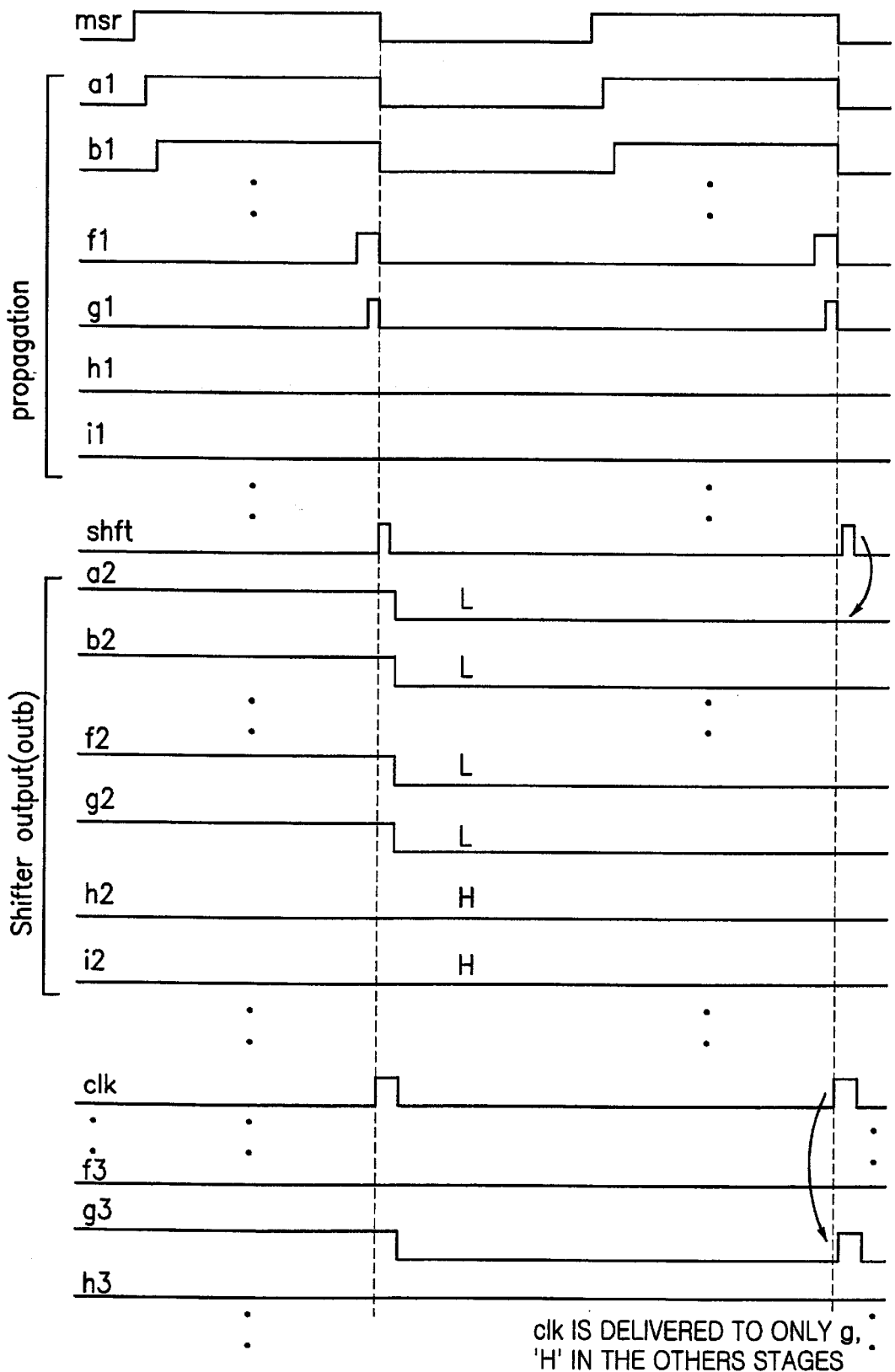
FIG. 8 is a timing diagram illustrating operations of the DLL clock generator in accordance with the present invention.

FIG. 8 shows a timing diagram of output clock signals of delay chains at nodes al to il. As the first control signal passes through more delay chains, the shift of the first control signal to a high level is delayed. Accordingly, the pulse width becomes smaller and there is no shift to the high level in the stages after h1. In other words, a waveform of the first control signal is propagated from the first stage in order. When the first control signal is a low level, each output signal al to il of the delay chain in all stages are a low level. Hence, when the first control signal is a high level, the delay chains are enabled and the high level signal is propagated through the delay chains, to thereby shift each of the output signals al to il of the delay chains to high level in order.

If the first control signal becomes a low level, all of the delay chains are reset to a low level. Accordingly, a high level signal is propagated through the delay chains only while the first control signal is a high level. For example, in FIG. 8, the hiqh level signal is propagated as far as the output node g1 (the ninth stage), the output signals of the delay chains in farther stages, that is, from the output node h1, keep low level.

On the other hands, the delay chain includes an inverter 41, a shifter 42 receiving the second control signal shft and the third control signal shift_reset, a NOR gate 43 performing NOR logical operation of output signals of the shifters 42 in current and next stages and an inverter 44 inverting an output signal of the NOR gate 43.

Figure 6:
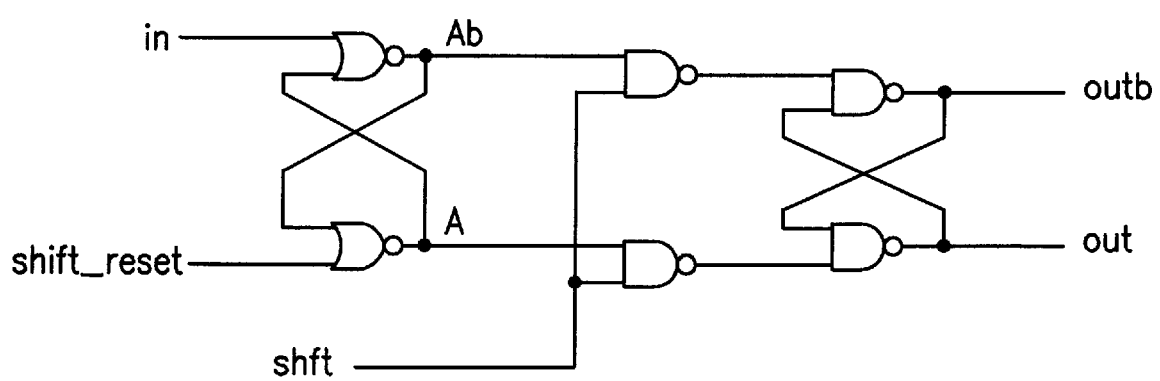
FIG. 6 is a circuit diagram of a shifter in FIGS. 4 and 5.

Referring to FIG. 6, a detailed circuit diagram of the shifter 42 is illustrated. As shown in FIG. 6, the shifter 42 includes a R-S latch circuit receiving an output of the delay chain and the third control signal shift_reset. When one input, that is, the output of the delay chain is a low level while the third control signal shift_reset is also a low level, the R-S latch circuit stores the previous reset signal. However, when a high level pulse is inputted, the R-S latch circuit has an inverted value of the reset value. As shown in FIG. 8, the second control signal shft is applied to the shifter after the first control signal becomes a low level, an output signal of the shifter 42 through which the high level signal passes has a different value from an output signal of the shifter 42 through which the high level signal does not pass. The other outputting out of the shifter 42 has a reverse phase.

The two outputs out and outb of the shifter 42 are applied to the three-input-NOR gate 43. The outputs out and outb of the shifter 42 determine whether the clock signal clk is outputted through the three-input-NOR gate 43. Referring to FIGS. 4 and 5, only the three-input-NOR gate 43 in a circle can pass the clock signal clk. The stage in the circle is the last stage (the seventh stage) to which a high level signal is propagated while the first control signal msr is high.

Since the NOR gates 43 in the first stage to the sixth stage receives the high level signal from the shifter of the next stage, the output signal at the node a3 to f3 are a high level without regard to the clock signal, whereby there is no propagation in these stages.

Though the NOR gates 43 on and after the eighth stage receive the low level signal from the shifter of the next stage, as can be shown, the outputs outb of the shifter in these stages are always high, and then the output signals of the shifters are a high level, whereby there is no propagation in these stages. Therefore, only the NOR gate 43 in the seventh stage propagates the clock. In other words, since the NOR gate 43 in the seventh stage receives the clock signal clk, the low level output signal outb of the shifter at node g2 and the low level output signal out of the shifter of the next stage, the clock is propagated.

Therefore, since the clock signal clk applied at this point passes a predetermined number of delay chains, which the predetermined number is the same as the pulse width of the first control signal msr, the DLL clock dll_clk is delayed by the pulse width $t_{d2}$ of the first control signal.

Figure 9:
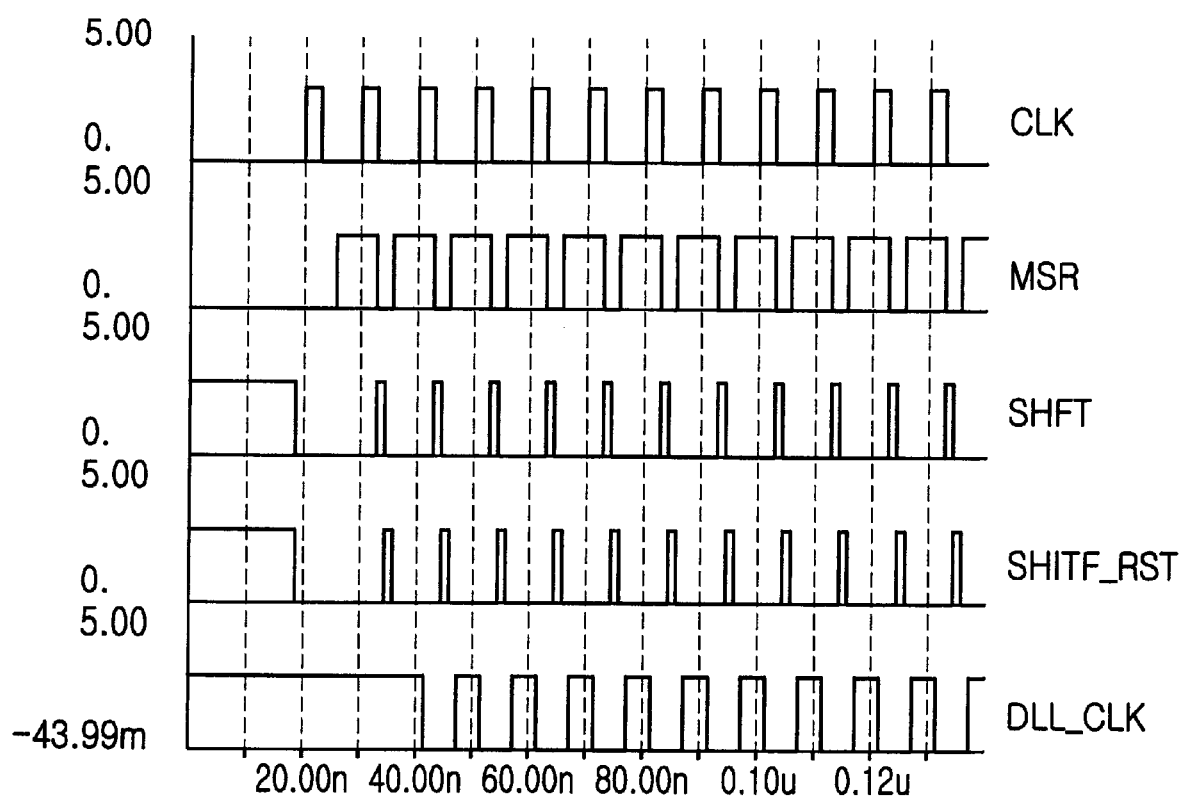
FIG. 9 is a graph illustrating simulation results of the circuit in FIG. 4.

FIG. 9 shows simulation results of the circuit in FIG. 4. The DLL clock can be obtained after three clocks from operation of the DLL clock generator. The DLL clock is generated by delaying the clock signal as much as the pulse width of the first control signal msr. The pulse width of the first control signal msr corresponds to delay $t_{d2}$.

Conversion of the pulse width of the first control signal msr to a delay by using the delay chains is important in the specification. The delay chain can be implemented in various features. Various embodiments of the delay chain are illustrated in FIGS. 10 to 13.

Figure 10:
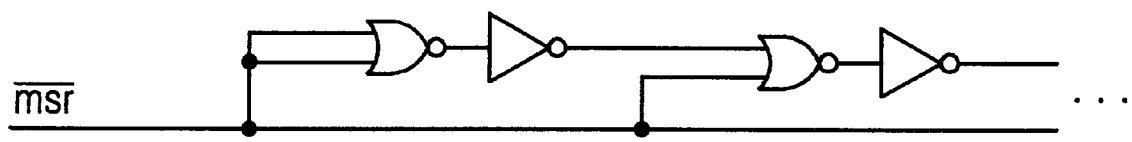
FIG. 10 is a circuit diagram showing a delay chain in accordance with another embodiment of the present invention.

Referring to FIG. 10, NOR gates are used instead of the NAND gates and an inverted first control signal /msr is inputted to the delay chain. When the inverted first control signal /msr is a high level, all outputs of the delay chain are high levels and disabled. When the inverted first control signal /msr is a low level, the low level clock signal is propagated. Accordingly, the shift and locking unit should be changed equivalently.

Figure 11:
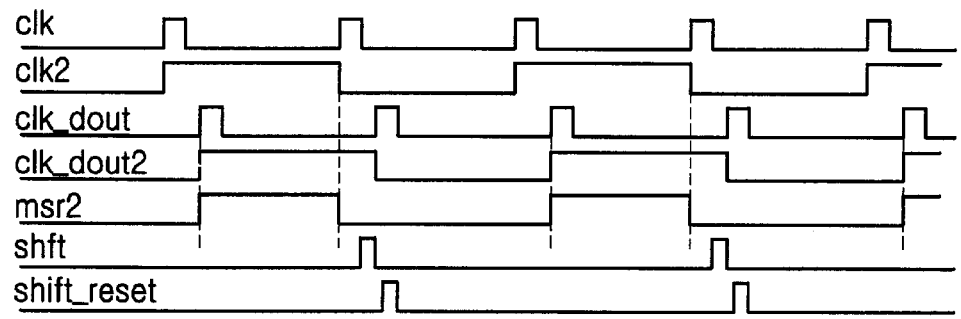
FIG. 11 is a timing diagram showing signals when a period of the clock is doubled.
Figure 12:
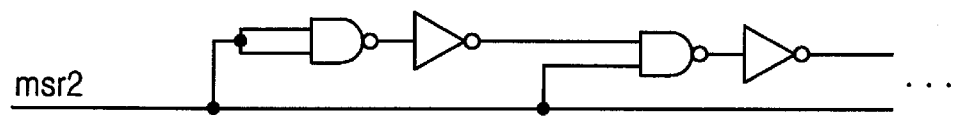
FIGS. 12 and 13 are circuit diagrams showing delay chains in accordance with still another embodiment of the present invention.

In the embodiments mentioned, the first control signal is generated at every clock. However, there is no problem in generation of the first control signal msr at every two clocks. Waveforms of this case are illustrated in FIG. 11. In other words, a second clock signal clk2 and a second data output clock signal clk_dout2 have periods two times the clock signal clk and the data output clock signal clk_dout. Accordingly, the first control signal msr2 made of a second clock signal clk2 and a second data output clock signal clk_dout2 has two periods in comparison with the first control signal msr mentioned previously. The second and the third control signals having two periods are generated in a similar way. In this embodiment, delay chains illustrated in FIG. 12 can be used.

Figure 13:
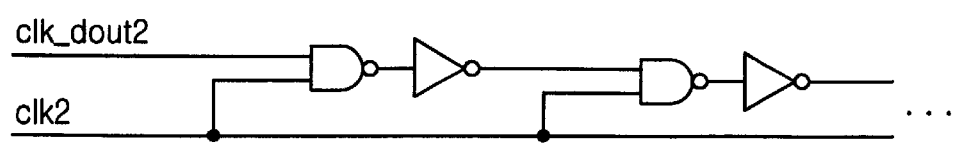

The clock signals clk2 and clk_dout2 having two periods can be used instead of the first control signal msr2 as shown in FIG. 13, because the first control signal msr2 is equal to the result of AND logical operation of the two clock signals clk2 and clk_dout2. That is, the first control signal msr2 can be expressed as following: measure2=clk2 AND clk_dout2. Also, the inverted first control signal /msr2 can be expressed as following: /msr2=/clk2 OR /clk_dout2. Therefore, the changes as described with reference to FIG. 11 can be implemented.

Using the same principles, the period of the clock signals can be increased as much as four times or more.

Figure 14:
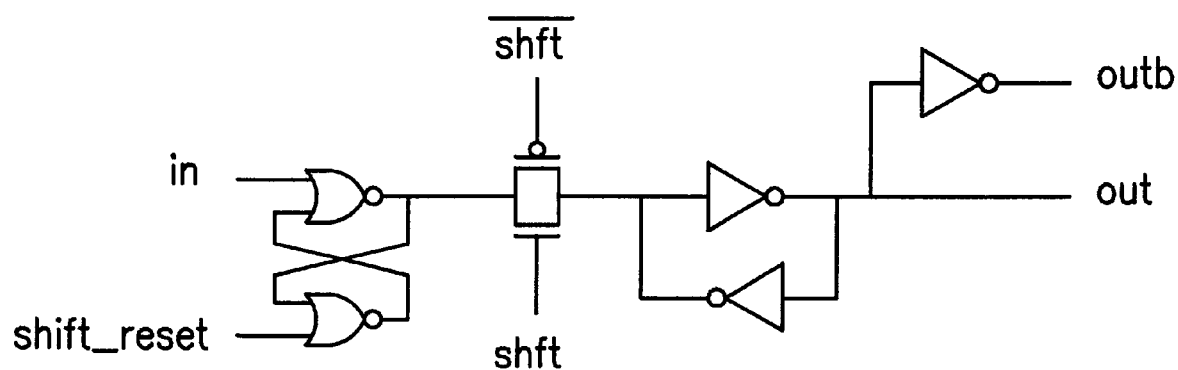
FIGS. 14 and 15 are circuit diagrams showing shifters in accordance with another embodiment of the present invention.
Figure 15:
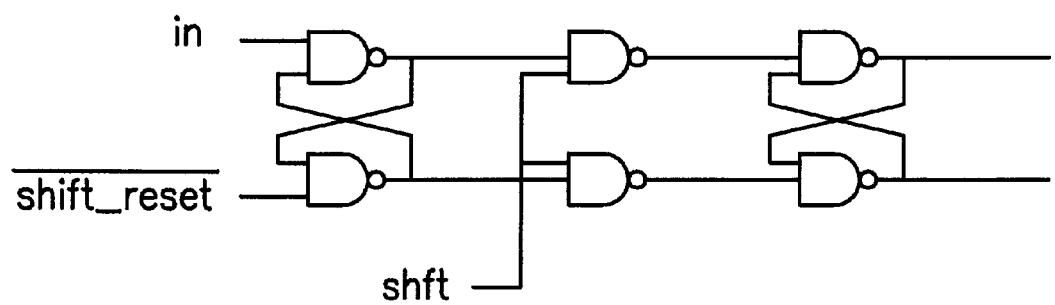

The shifter can be equivalently implemented as shown in FIGS. 14 and 15.

Using the DLL clock generator in accordance with the embodiments of the present invention, stable, accurate and digital sit can be obtained within a short time in DDR SDPRAM.

Although the preferred embodiments of the invention have been disclosed for illustrative purpose, those skilled in the art will appreciate that various modifications, additions and substitutions are possible, without departing from the scope and spirit of the invention as disclosed in accompanying claims.

What is claimed is:

1. An apparatus for generating a delayed locked loop (DLL) clock signal, comprising:
   a first clock generator for receiving a first clock signal from an external synchronization clock signal, said first clock signal having a first time period, and said first clock generator for generating a second clock signal delayed by a first delay time in comparison with the first clock signal;
   a second clock generator for generating a first control signal having a pulse width corresponding to a difference between the first time period and the first delay time;
   a third clock generator for generating a DLL clock signal which is slower than the first clock signal by the pulse width of the first control signal; and
   wherein said second clock generator generates a second and a third control signal for shifting a delayed first control signal.

2. The apparatus as claimed in claim 1, wherein said third clock generator includes a plurality of stages,
   wherein the stage includes:
       a first delay chain for delaying the first control signal by a predetermined time;
       a shifter for shifting the first control signal responsive to the second and the third control signals from the first delay chain and for generating a first output signal and a second output signal;
       a logical operator for receiving the first clock signal, the first output signal from the shifter in a current stage and a second output signal from the shifter in a next stage and for propagating a third clock signal corresponding to the first clock signal; and
       a second delay chain having a delay time which is the same as the first delay chain, for delaying the third clock signal.

3. The apparatus as claimed in claim 2, wherein the first delay chain reduces the pulse width of the first control signal by delaying in synchronization with only a rising edge of the first control signal.

4. The apparatus as claimed in claim 2, wherein the first control signal is generated based on a fourth clock and a fifth clock of which periods are n times as the period of the first clock, wherein n is a integer number and two and more.

5. An apparatus for generating a delayed locked loop (DLL) clock signal, comprising:
   a pulse generator for generating a first pulse signal, said first pulse signal having a pulse width corresponding to a predetermined delay time;
   a first delay chain having a plurality of delay means, said first delay chain for delaying the first pulse signal by said predetermined delay time in a predetermined order;
   a second delay chain having a second delay time equal to the predetermined delay time of the first delay chain, said second delay chain for delaying an external clock signal responsive to an output signal from the plurality of delay means; and
   wherein said pulse generator generates a second and a third pulse signal for shifting a delayed first pulse signal.

6. The apparatus as claimed in claim 5, wherein the pulse is generated through the same path as a path through which the external clock signal is inputted and the delayed external clock signal is outputted.

* * * * *